(12) United States Patent
Park

(10) Patent No.: US 6,790,754 B2
(45) Date of Patent: Sep. 14, 2004

(54) METHODS FOR MANUFACTURING A SEMICONDUCTOR DEVICE

(75) Inventor: Cheolsoo Park, Seoul (KR)

(73) Assignee: Dongbu Electronics, Seoul (KR)

(*) Notice: Subject to any disclaimer, the term of this patent is extended or adjusted under 35 U.S.C. 154(b) by 0 days.

(21) Appl. No.: 10/747,595

(22) Filed: Dec. 29, 2003

(65) Prior Publication Data

US 2004/0142521 A1 Jul. 22, 2004

(30) Foreign Application Priority Data

Dec. 30, 2002 (KR) .............................. 10-2002-0086232

(51) Int. Cl.[7] .......................................... H01L 21/3205
(52) U.S. Cl. ...................... 438/585; 438/197; 438/287; 438/291; 438/304; 438/424; 438/586; 438/591
(58) Field of Search ................................ 438/183, 184, 438/197, 216, 217, 259, 287, 298, 291, 303, 304, 424, 585, 586, 589, 591, 596, 597

(56) References Cited

U.S. PATENT DOCUMENTS 6,169,003 B1 * 1/2001 Hu et al. .................... 438/299
6,287,926 B1 * 9/2001 Hu et al. .................... 438/306
2004/0076050 A1 * 4/2004 Hsieh ........................ 365/200

* cited by examiner

Primary Examiner—Jack Chen
(74) Attorney, Agent, or Firm—Grossman & Flight, LLC

(57) ABSTRACT

Method for forming contact electrodes in a semiconductor device are disclosed. An example method comprises sequentially forming a pad oxide layer, a pad nitride layer, a dummy oxide layer, and a capping nitride layer on a substrate. These layers and the substrate are then patterned to form a trench. The trench us filled with an insulating material to form a device isolation stripe. The resulting structure is then patterned to form a trench. Spacers are formed on the sidewalls of the trench and ions are implanted into the substrate beneath the trench to form local channel portions. A gate insulating layer and a gate electrode are then formed by deposition. Thereafter, the dummy oxide layer and the capping nitride layer are removed and source/drain portions are defined. Contact electrodes are then formed by deposition of a metal layer.

9 Claims, 11 Drawing Sheets

US 6,790,754 B2

METHODS FOR MANUFACTURING A SEMICONDUCTOR DEVICE

FIELD OF THE DISCLOSURE

The present disclosure relates to methods for manufacturing a semiconductor device; and, more particularly, to a method for forming contact electrodes in a semiconductor device.

BACKGROUND

Generally, in designing and/or manufacturing semiconductor devices, employing a single layer for locating wiring on a semiconductor substrate provides little freedom in designing a desired wiring pattern. For example, in this single layer context, if a designer expands an actual length of wiring, the designer may severely restrict the layout of the semiconductor device.

In contrast, employing multiple layers for wiring enables a highly efficient layout design for a semiconductor device. That is, since each semiconductor layout can be determined without having to consider spots where wiring passes over the semiconductor substrate, the integration of the semiconductor device is enhanced. As a result, the size of the semiconductor device can be reduced or minimized. Further, since employing multiple layers makes it possible to design the wiring more freely and easily, the wiring resistance and the current capacity can be configured with more freedom.

Micromachining techniques have been developed recently. These developments have occurred along with increased integration and increased capability of integrated semiconductors. A chemical mechanical polishing (CMP) technique is one of the newly developed techniques. The CMP technique is used for LSI manufacturing processes; particularly in such functions as: (a) the planarization of an insulating layer, (b) forming a metal plug, and/or (c) forming a buried wiring for a multiple layer wiring process. This CMP technique is described in U.S. Pat. No. 4,944,836.

However, as the integration of semiconductor devices increases, limitations and drawbacks in forming a gate electrode having a small critical dimension are encountered. For example, as the critical dimension of the gate electrode decreases, a short channel effect occurs in which a threshold voltage becomes small due to a shorter length between a source channel and a drain channel.

Further, as the gate electrode becomes smaller, the insulating layer for the gate electrode becomes thin. As a result, the threshold voltage of the gate electrode also becomes small by a reverse narrow width effect.

It is known to use a conventional lithography process to manufacture a gate electrode having a narrow line width by using a notch profile with the use of a photolithographic pattern. However, this known process entails preparing a mask having a minimized device pattern for patterning the corresponding gate electrode. It is, therefore, indispensable to develop a light source for exposing, or an exposing device for minimizing, the mask and for exposing the photoresist pattern.

DETAILED DESCRIPTION

FIGS. 1A to 1K illustrate an example procedure for forming contact electrodes in a semiconductor device.

Figure 1A:
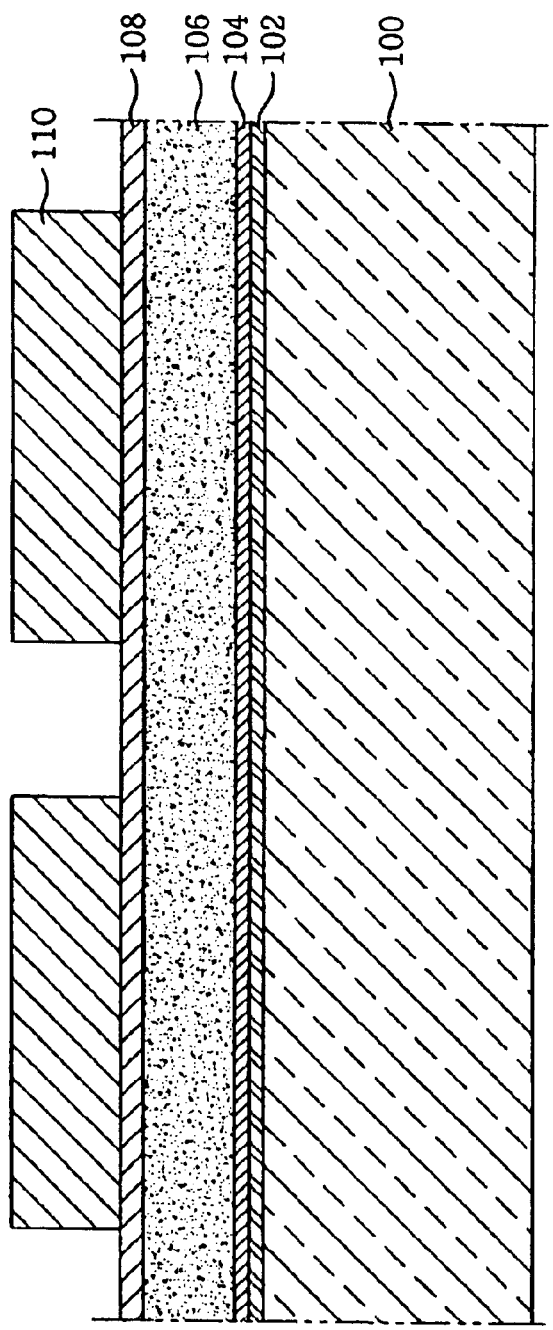
FIGS. 1A to 1K illustrate an example procedure for forming contact electrodes in a semiconductor device in accordance with the teachings of the present disclosure.

Referring to FIG. 1A, a pad oxide layer 102, a pad nitride layer 104, a dummy oxide layer 106, and a capping nitride layer 108 are deposited sequentially on a semiconductor substrate 100. A photoresist layer is then applied over the capping nitride layer 108. The photoresist layer is photolithographically patterned so that a photoresist mask 110 is formed to define a device isolation region. The pad oxide layer 102, the pad nitride layer 104, the dummy oxide layer 106, and the capping nitride layer 108 have thicknesses in the ranges of about 50 to 100 angstroms, about 100 to 200 angstroms, about 1500 to 2500 angstroms, and about hundreds angstroms, respectively.

Figure 1B:
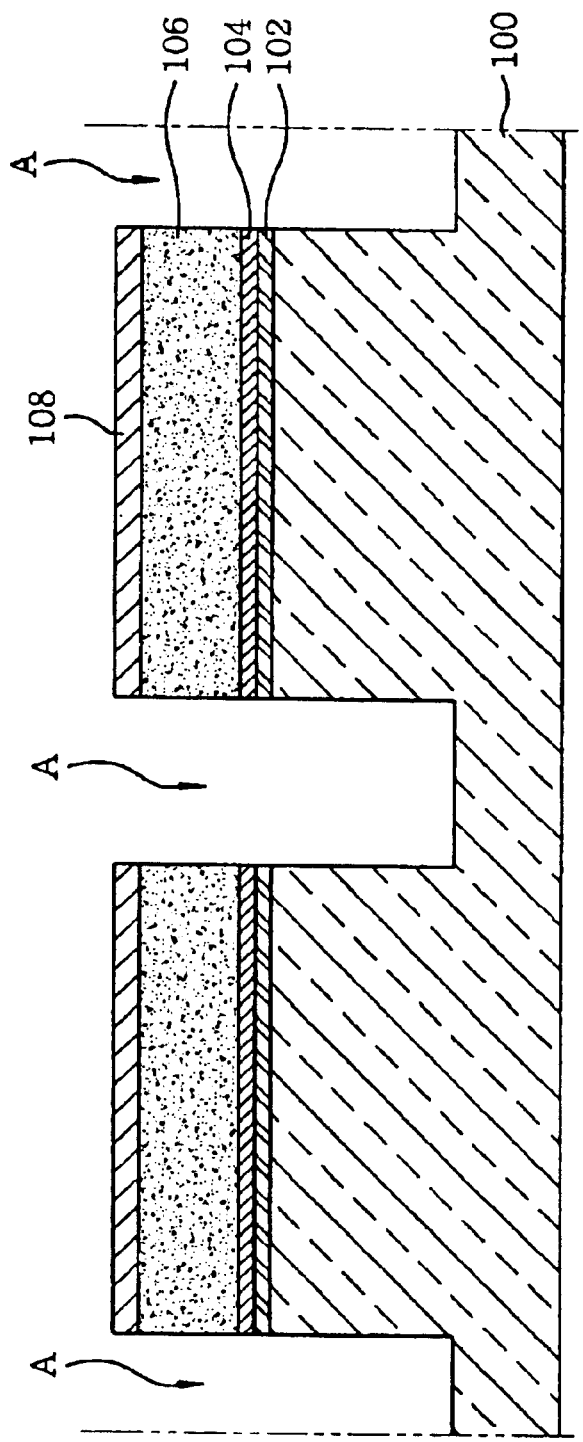

Referring to FIG. 1B, the capping nitride layer 108, the dummy oxide layer 106, the pad nitride layer 104 and the pad oxide layer 102 are etched sequentially using the photoresist mask 10. Then, an exposed portion of the substrate 100 is further etched by a dry etching process to form a trench A for device isolation. Thereafter, the photoresist mask 10 is removed by conventional means.

Figure 1C:
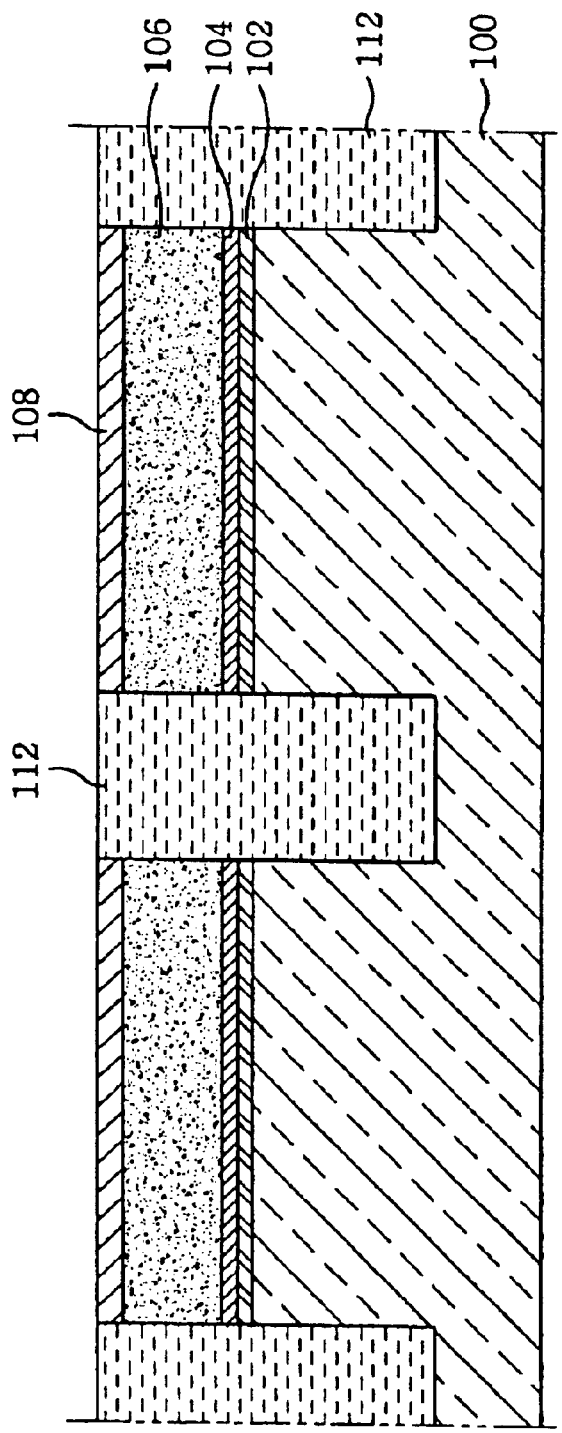

Referring to FIG. 1C, an insulating material is deposited to fill the trench A. The insulating material is then planarized by a CMP process to form a device isolation stripe 112. The CMP process is performed until the capping nitride layer 108 is exposed.

Figure 1D:
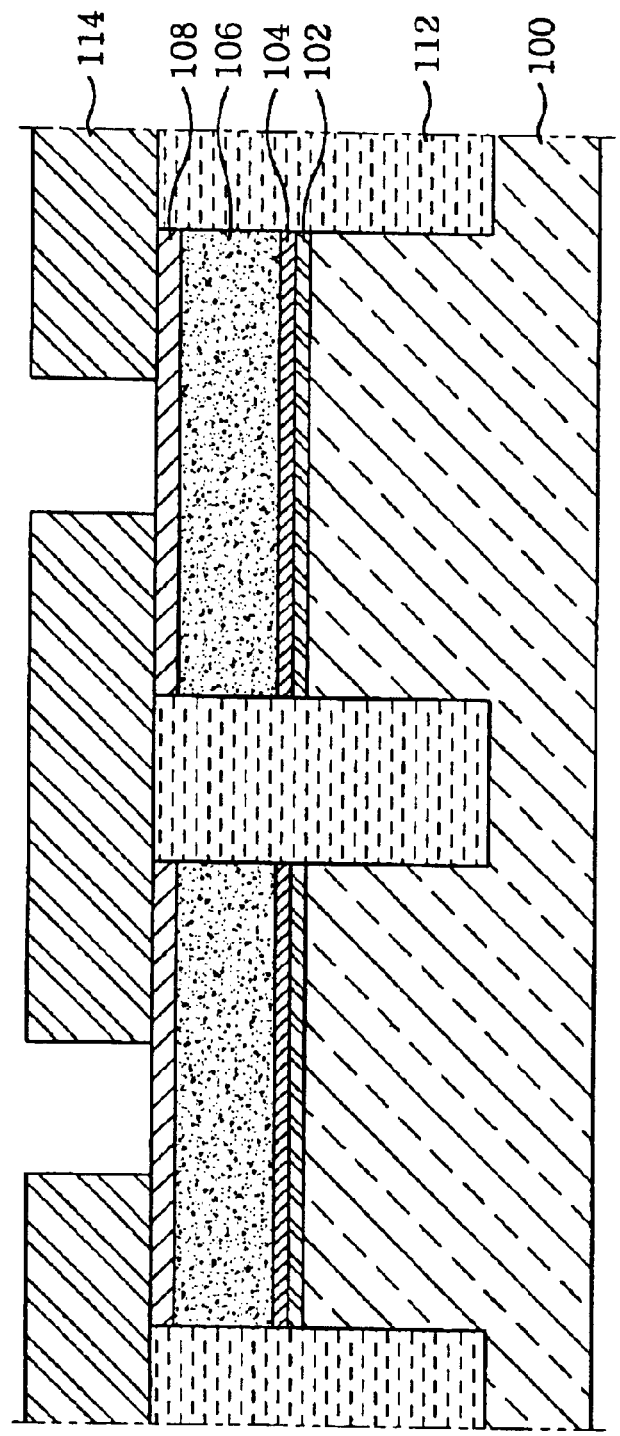

Referring to FIG. 1D, a photoresist layer is applied on the structure of FIG. 1C. The photoresist layer is then patterned to form a photoresist mask 114 for a gate electrode. The photoresist mask exposes portions of the capping nitride layer 108.

Figure 1E:
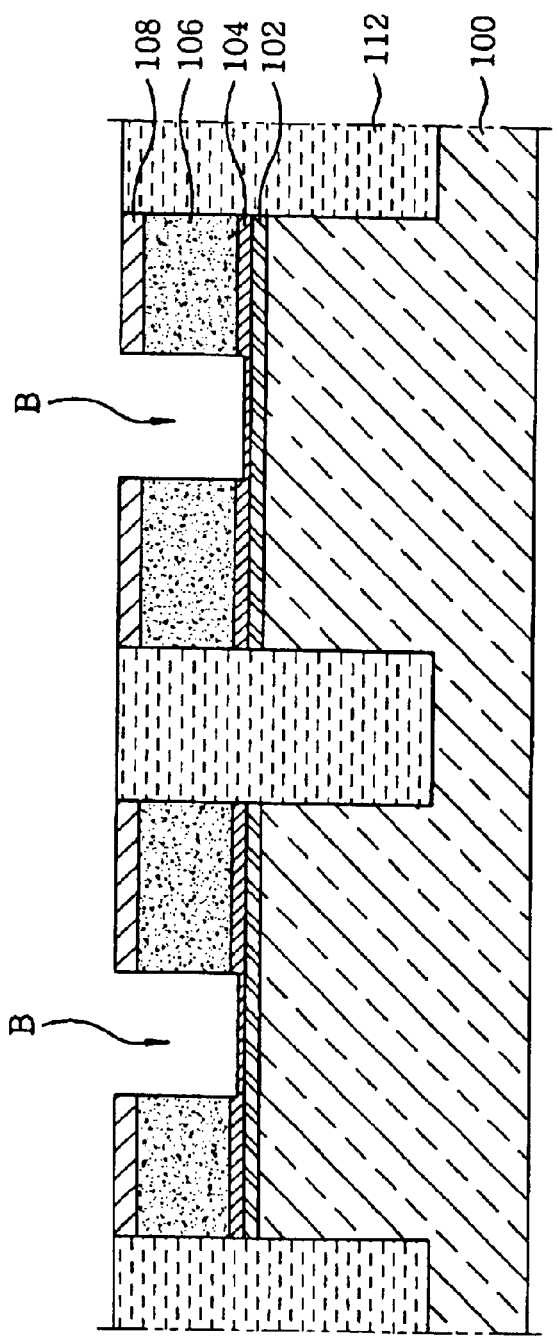

Referring to FIG. 1E, the capping nitride layer 108, the dummy oxide layer 106, and the pad nitride layer 104 are sequentially etched using the photoresist mask 114. This etching process results in the pad nitride layer 104 having a thickness of tens of angstroms to form a trench B where a gate electrode will be positioned. The photoresist mask 114 is then removed by conventional means.

Figure 1F:
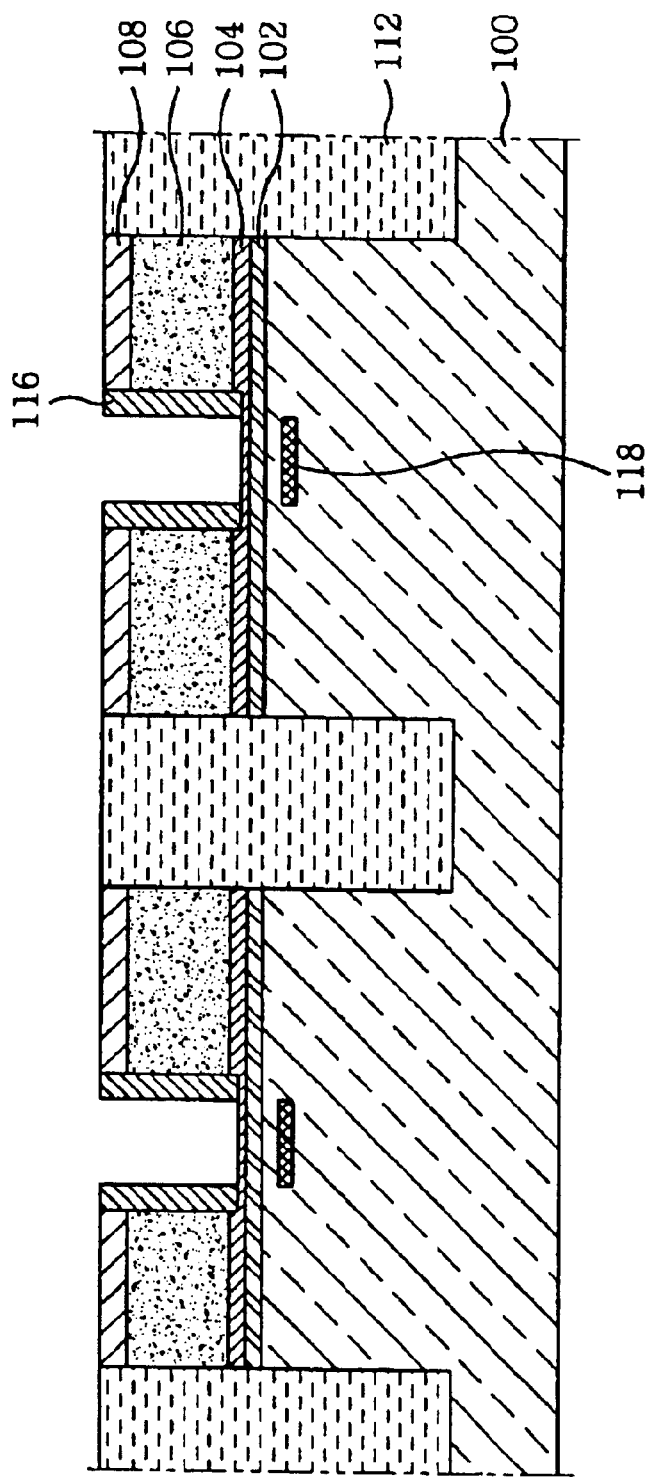

Referring to FIG. 1F, a conductive layer having a thickness of about 200 angstroms is deposited on the structure which was formed in the previous step. The conductive layer is then removed by a blanket etch back operation to form spacers 116 which function as low doped drains (LDD). These spacers 116 are intended to shrink the width of the gate electrode. Subsequently, ions are implanted through the pad nitride layer 104 and the pad oxide layer 102 between the spacers 116 into the substrate 100 to form local channel portions 118.

Figure 1G:
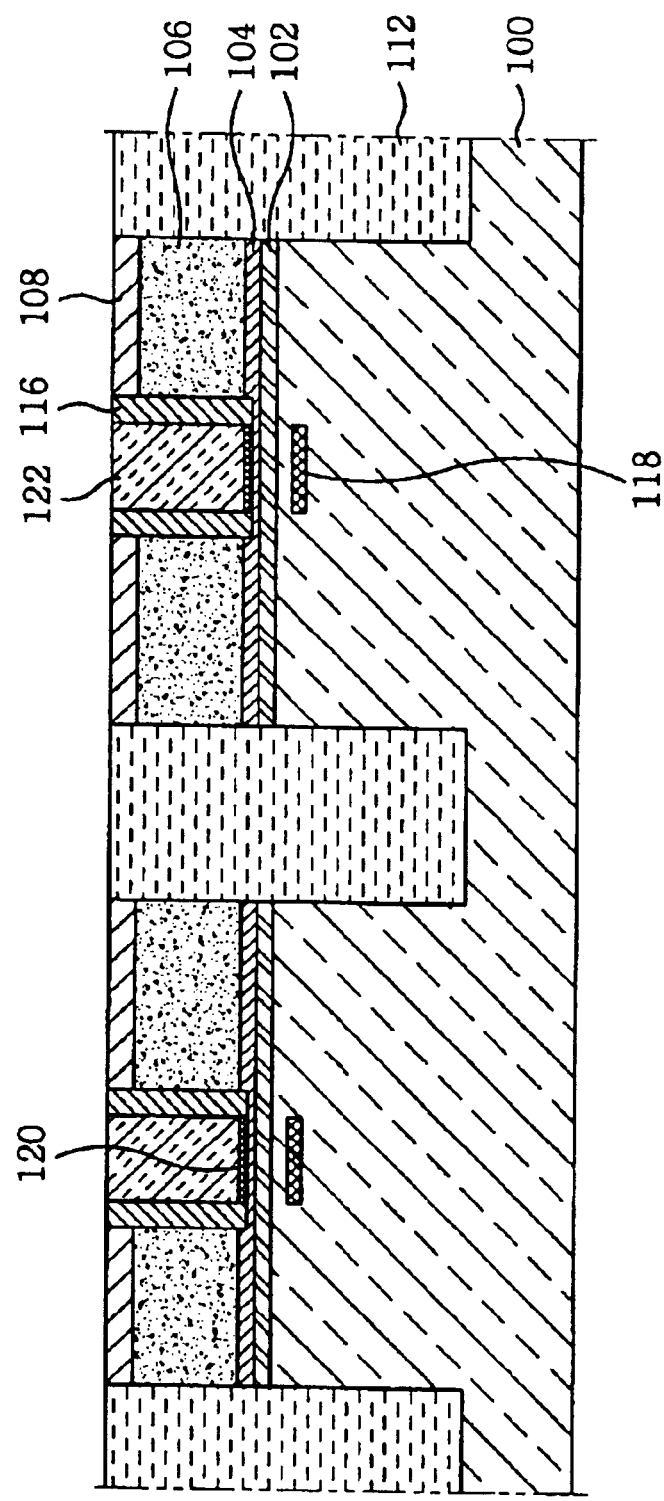

Referring to FIG. 1G, a gate insulating layer 120 and a conductive layer 122 for the gate electrode are sequentially deposited on the exposed pad nitride layer 104 between the spacers 116 and above the local channel portions 118. The conductive layer 122 is then planarized by conventional means.

Figure 1H:
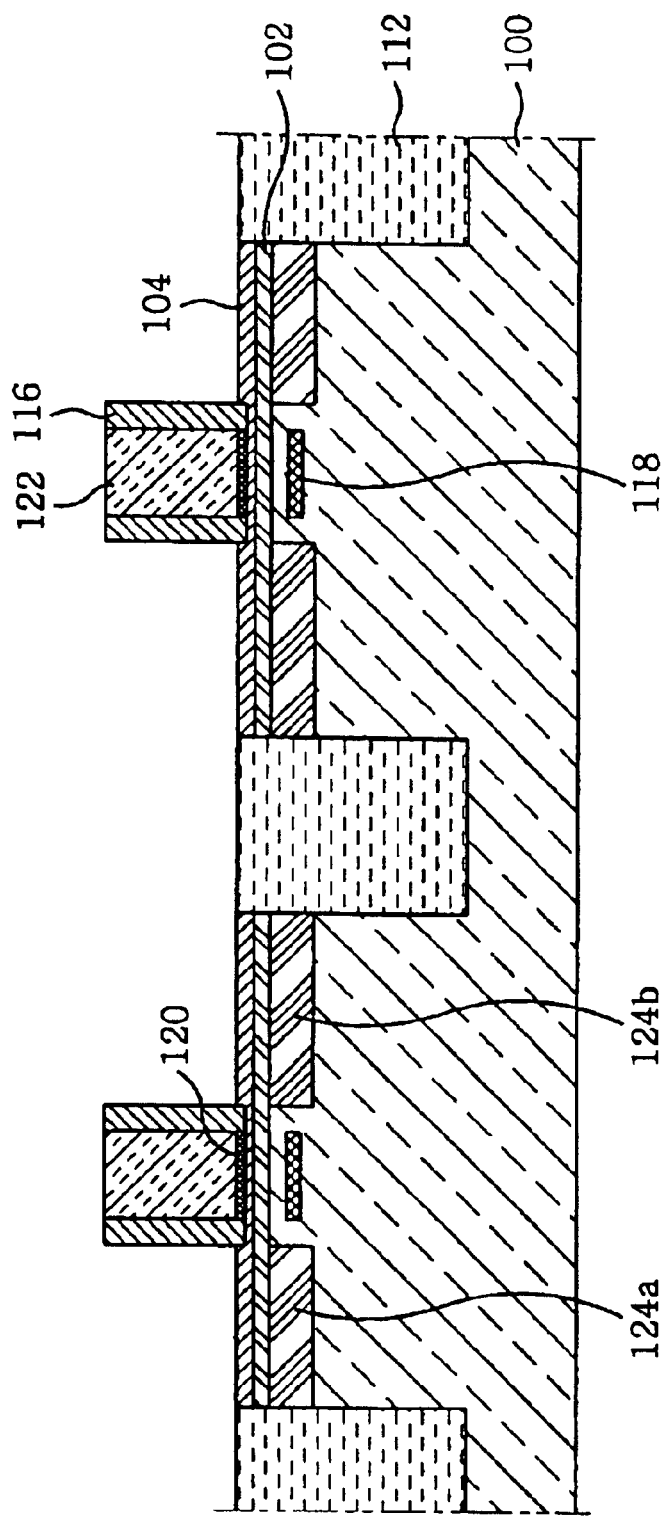

Referring to FIG. 1H, the dummy oxide layer 106, the capping nitride layer 108, and the device isolating stripe 112 are removed by a blanket etch back operation to leave the spacers 116 and the gate electrode 122 composed of the conductive layer. The blanket etch back operation is performed until the upper surface of the pad nitride layer 104 is exposed. Ions are then implanted into the substrate 100 to form source/drain portions 124a and 124b.

Figure 1I:
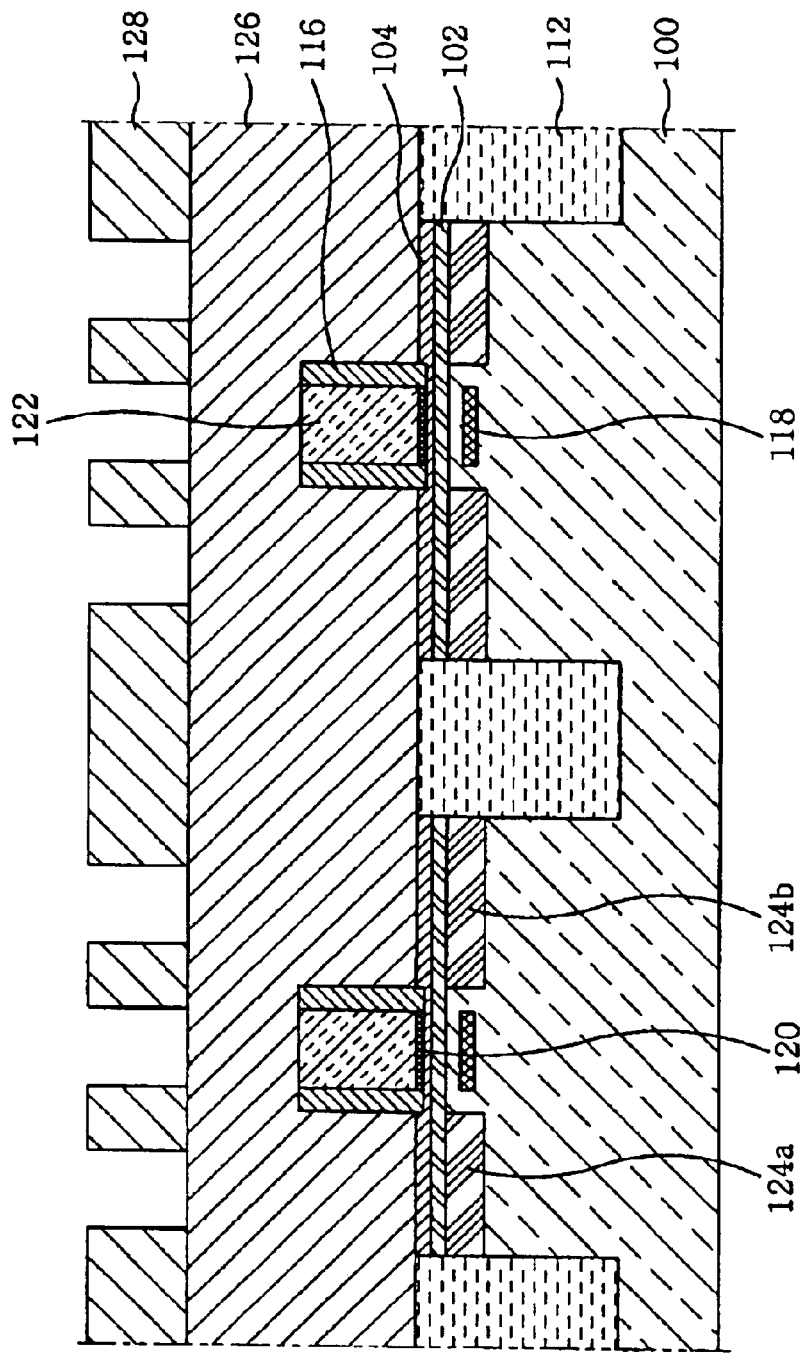

Referring to FIG. 1I, an insulating layer 126 is applied to entirely cover the structure which was formed in the previous step. A photoresist mask 128 for contact holes is then formed on the insulating layer 126.

Figure 1J:
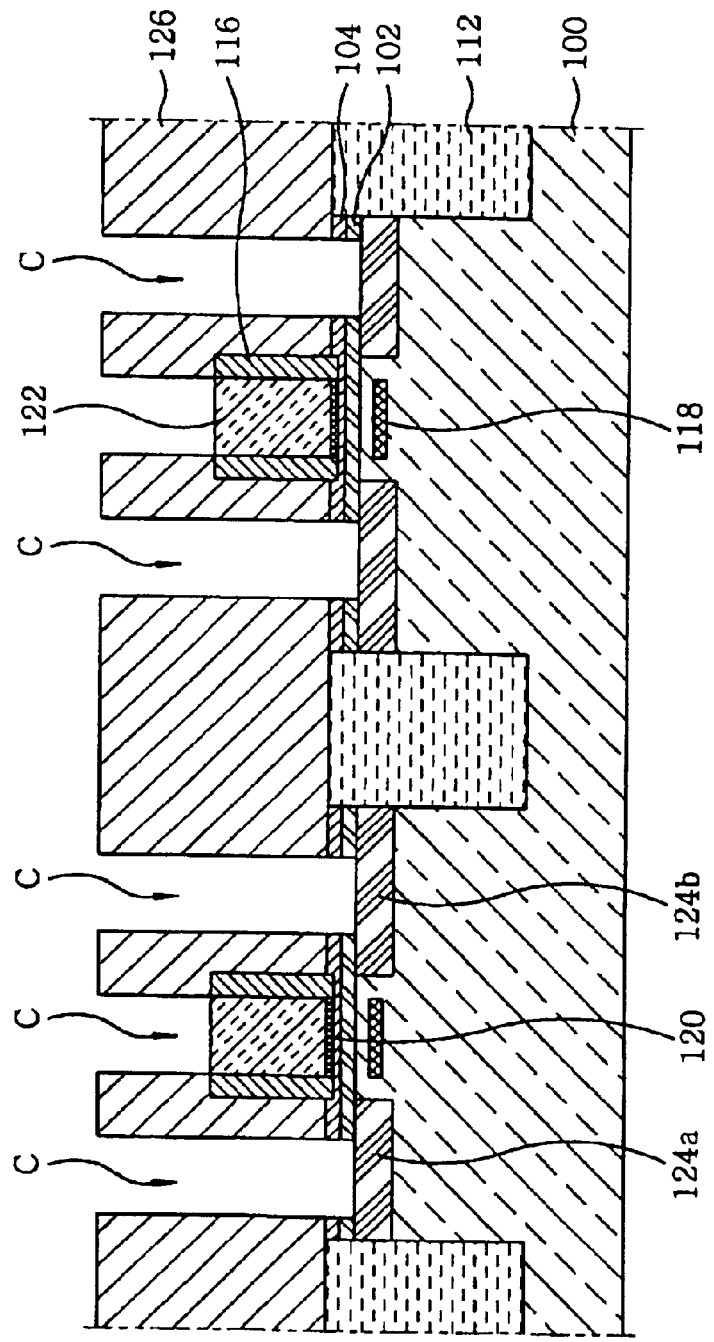

Referring to FIG. 1J, the insulating layer 126 is etched to form contact holes C, exposing parts of the source/drain portions 124a and 124b and the gate electrode 122. Thereafter, the photoresist mask 128 is removed by conventional means.

Figure 1K:
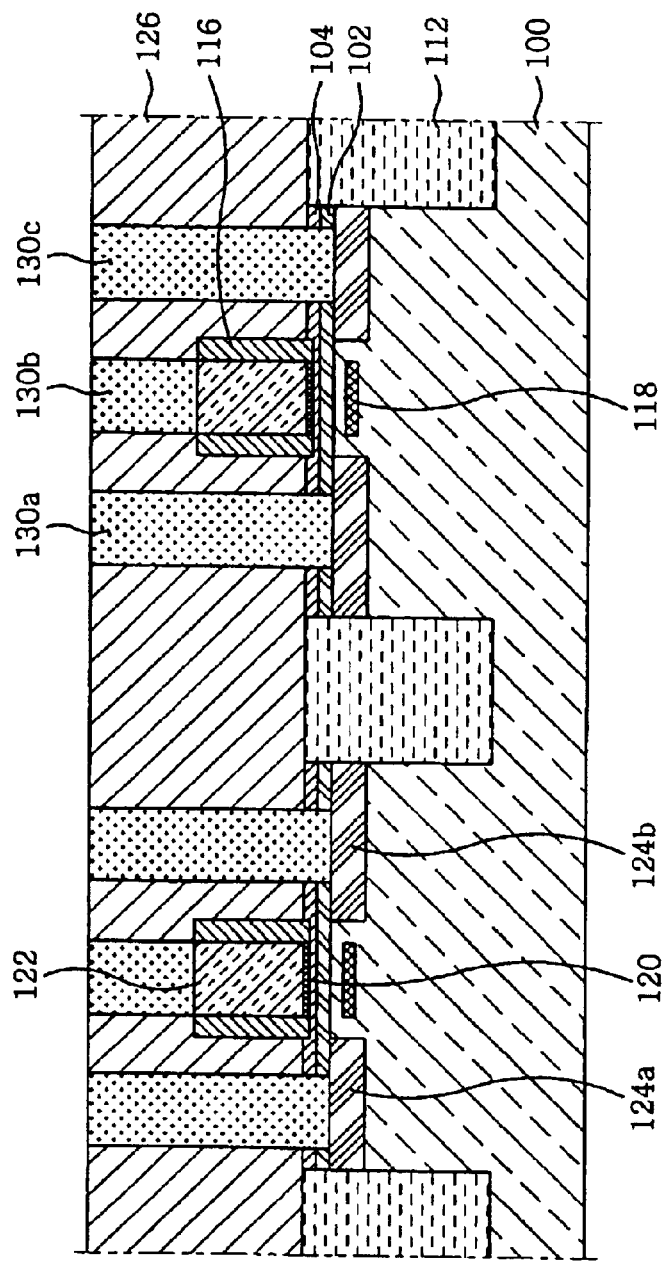

Referring to FIG. 1K, a metal layer is deposited on an upper surface of the structure of FIG. 1J by a chemical vapor deposition process for filling the contact holes C. A source plug 130a, a gate plug 130b and a drain plug 130c are then formed by a CMP process which leaves the metal in the contact holes C to thereby form contacts between the electrodes and a metal wiring of the semiconductor device.

Methods for controlling a critical dimension of the gate electrode by using a dummy oxide layer and a capping nitride layer as a hard mask which supports the forming of contact poles in a semiconductor device has been disclosed. By virtue of the disclosed methods, a short channel effect can be minimized, and a reverse narrow width effect and shrinkage of a gate insulating layer can be prevented.

From the foregoing, persons of ordinary skill in the art will appreciate that the illustrated method for forming contact electrodes in a semiconductor device comprises: sequentially forming a pad oxide layer, a pad nitride layer, a dummy oxide layer and a capping nitride layer on a semiconductor substrate; patterning the capping nitride layer, the dummy oxide layer, the pad nitride layer and the pad oxide layer; etching the semiconductor substrate to a predetermined depth to form a trench in the semiconductor substrate; filling the trench with an insulating material to form a device isolation stripe; patterning the capping nitride layer, the dummy oxide layer, and the pad nitride layer, wherein the pad nitride layer has a thickness of tens of angstroms to form a gate electrode; forming spacers on sidewalls of the capping nitride layer, the dummy oxide layer and the pad nitride layer, implanting ions through the pad nitride layer and the pad oxide layer to form a local channel portion in the semiconductor substrate; sequentially forming a gate insulating layer and a gate electrode on the pad nitride layer between the spacers; etching the capping nitride layer, the dummy oxide layer and the device isolation stripe until the pad nitride layer is exposed; and implanting ions through the pad oxide layer to form a source/drain conductor substrate.

Although certain example methods and apparatus have been described herein, the scope of coverage of this patent is not limited thereto. On the contrary, this patent covers all methods, apparatus and articles of manufactures fairly falling within the scope of the appended claims either literally or under the doctrine of equivalents.

What is claimed is:

1. A method for forming contact electrodes in a semiconductor device comprising:

sequentially forming a pad oxide layer, a pad nitride layer, a dummy oxide layer and a capping nitride layer on a semiconductor substrate;

patterning the capping nitride layer, the dummy oxide layer, the pad nitride layer and the pad oxide layer;

etching the semiconductor substrate to a predetermined depth to form a trench in the semiconductor substrate;

filling the trench with an insulating material to form a device isolation stripe;

patterning the capping nitride layer, the dummy oxide layer, and a portion of the pad nitride layer, wherein a remaining portion of the pad nitride layer has a thickness of tens of angstroms to form a second trench where a gate electrode will be positioned;

forming spacers on sidewalls of the capping nitride layer, the dummy oxide layer and the pad nitride layer;

implanting ions through the remaining portion of the pad nitride layer and the pad oxide layer to form a local channel portion in the semiconductor substrate;

sequentially forming a gate insulating layer and a gate electrode on the remaining portion of the pad nitride layer between the spacers;

etching the capping nitride layer, the dummy oxide layer and the device isolation stripe until the pad nitride layer is exposed; and implanting ions through the pad nitride layer and the pad oxide layer to form a source/drain portions in the semiconductor substrate.

2. A method as defined in claim 1, wherein implanting the ions to form the source/drain portions results in an intermediate structure, and further comprising:

depositing an insulating material on the intermediate structure; and forming a contact electrode on the gate electrode and on at least one of the source/drain portions.

3. A method as defined in claim 1, wherein the pad oxide layer has a thickness of about 50 to 100 angstroms.

4. A method as defined in claim 1, wherein the pad nitride layer has a thickness of about 100 to 200 angstroms.

5. A method as defined in claim 1, wherein the capping nitride layer has a thickness of about hundreds of angstroms.

6. A method as defined in claim 1, wherein the spacers are comprise a conducting material having a thickness of about 200 angstroms.

7. A method as defined in claim 1, wherein filling the trench with the insulating material to form the device isolation stripe further comprises:

performing a planarization process on the insulating material until the capping nitride layer is exposed.

8. A method as defined in claim 7, wherein the planarization process is a chemical mechanical polishing process.

9. A method as defined in claim 1, wherein etching the capping nitride layer, the dummy oxide layer and the device isolation stripe comprises performing a blanket etch back process.

* * * * *